United States Patent
Harao et al.

(10) Patent No.: US 9,693,466 B2
(45) Date of Patent: Jun. 27, 2017

(54) WIRING BOARD AND MANUFACTURING METHOD THEREOF

(75) Inventors: Akira Harao, Makinohara (JP);
Mototatsu Matsunaga, Makinohara (JP); Yusuke Takagi, Makinohara (JP);
Akinori Saneto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/397,867

(22) Filed: Feb. 16, 2012

(65) Prior Publication Data

US 2012/0211266 A1 Aug. 23, 2012

(30) Foreign Application Priority Data

Feb. 22, 2011 (JP) ................... 2011-035338
Jun. 20, 2011 (JP) ................... 2011-136176

(51) Int. Cl.
*H05K 3/44* (2006.01)
*H05K 3/32* (2006.01)
(Continued)

(52) U.S. Cl.
CPC ............. *H05K 3/445* (2013.01); *H05K 3/325* (2013.01); *H05K 1/0366* (2013.01); *H05K 1/056* (2013.01);
(Continued)

(58) Field of Classification Search
CPC .... H05K 3/3452; H05K 1/021; H05K 1/0212;
H05K 1/0215; H05K 1/023; H05K 1/0231; H05K 1/0233; H05K 1/0234;
H05K 1/0243; H05K 1/0295; H05K 1/14;
H05K 1/141; H05K 1/142; H05K 1/144;
H05K 1/145; H05K 1/16; H05K 1/162;
H05K 1/165; H05K 1/167; H05K 1/18;
H05K 1/181; H05K 1/182; H05K 1/183;
H05K 1/184; H05K 1/185; H05K 2201/0317; H05K 2201/041; H05K 2201/049;
(Continued)

(56) References Cited

U.S. PATENT DOCUMENTS 4,894,271 A * 1/1990 Hani .................. B32B 15/14
156/89.15
6,541,712 B1 * 4/2003 Gately et al. ............... 174/266
(Continued)

FOREIGN PATENT DOCUMENTS

CN 1852636 A 10/2006
CN 201601891 U 10/2010
(Continued)

OTHER PUBLICATIONS

JP 08-316601 Abstract English Translation and Figures.*
(Continued)

*Primary Examiner* — Pete Lee
(74) *Attorney, Agent, or Firm* — Locke Lord LLP

(57) ABSTRACT

The present invention is to provide a wiring board which can prevent whitening. The wiring board is made of a fiber reinforced resin plate, and has a through hole and a whitening prevention portion. The whitening prevention portion is made only with matrix resin forming the fiber reinforced resin plate, and is integrally formed in the fiber reinforced resin plate. Furthermore, the whitening prevention portion is arranged around the through hole.

1 Claim, 4 Drawing Sheets

(51) Int. Cl.
  *H05K 1/03* (2006.01)
  *H05K 1/05* (2006.01)
(52) U.S. Cl.
  CPC .............. *H05K 2201/1059* (2013.01); *H05K 2201/1081* (2013.01)
(58) Field of Classification Search
  CPC ......... H05K 2201/09763; H05K 2201/09872; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 2201/0129; H05K 2201/0195; H05K 2201/023; H05K 2201/0239; H05K 3/321; H05K 1/0254; H05K 1/0306; H05K 1/0313; H05K 1/0353; H05K 1/0366; H05K 1/0373; H05K 1/038; H05K 1/0386; H05K 2201/0141; H05K 2201/0145; H05K 2201/015; H05K 2201/0154; H05K 2201/0158; H05K 2201/0162; H05K 2201/0166; H05K 2201/037; H05K 2201/0959; H05K 2201/09645; H05K 2201/10666; H05K 2203/0455; H05K 3/4046; H05K 3/42; H05K 3/421; H05K 3/429; H05K 2201/09718; H05K 2201/09627; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 2201/09509; H05K 2201/09518; H05K 2201/09527; H05K 2201/09536; H05K 2201/09545; H05K 2201/09554; H05K 2201/09581; H05K 2201/096; H05K 2201/09609; H05K 2201/09618; H05K 1/0221; H05K 1/0222; H05K 1/0225; H05K 1/0251; H05K 1/112; H05K 1/115; H05K 1/116; H05K 2201/09063; H05K 2201/09072; H05K 2201/0919; H05K 2201/092; H05K 2201/095; H05K 1/0281; H05K 1/0283; H05K 1/118; H05K 1/147; H05K 1/148; H05K 1/189; H05K 2201/042; H05K 2201/046; H05K 2201/05; H05K 1/0206; H05K 1/0298; H05K 1/036; H05K 1/0393; H05K 1/05; H05K 1/11; H05K 1/111; H05K 1/114; H05K 1/117; H05K 1/119; H05K 2201/10378; H05K 3/4602; H05K 3/4691; H05K 1/0277; H05K 1/028; H01L 2924/3011; H01L 23/5226; H01L 24/50
  USPC .................................................. 174/250–265
  See application file for complete search history.

(56) References Cited

U.S. PATENT DOCUMENTS

| | | | |
|---|---|---|---|
| 7,002,080 B2* | 2/2006 | Tani et al. .................. | 174/258 |
| 7,038,142 B2* | 5/2006 | Abe ...................... | H01L 23/142 |
| | | | 174/255 |
| 8,203,080 B2* | 6/2012 | Vasoya ........................ | 174/255 |
| 2006/0175084 A1* | 8/2006 | Okamoto et al. ............. | 174/262 |
| 2008/0047742 A1* | 2/2008 | Samejima et al. ........... | 174/257 |
| 2008/0164057 A1* | 7/2008 | Mori et al. ................... | 174/262 |
| 2009/0308651 A1* | 12/2009 | Abe ...................... | H05K 3/445 |
| | | | 174/264 |

FOREIGN PATENT DOCUMENTS

| | | |
|---|---|---|
| JP | H07-86713 A | 3/1995 |
| JP | H08-316601 A | 11/1996 |
| JP | H11-87869 A | 3/1999 |
| JP | 2009-021016 A | 1/2009 |
| JP | 4512980 B2 | 7/2010 |

OTHER PUBLICATIONS

JP 11-87869 Abstract English Translation with Figures.*
JP 8-316601 published on Nov. 29, 1996; Abstract English Translation.*
JP 11-87869 published on Mar. 30, 1999; Abstract English Translation.*
JP 11-87869 published on Mar. 30, 1999; Abstract and English Translation.*
JP 11-87869 published on Mar. 30, 1999; English Translation hereinafter Junpei.*
Zhao, Long, "Notification of the First Office Action", Chinese Application No. 201210042250.2, mailed Mar. 25, 2014, 16 pages, The State Intellectual Property Office of the People's Republic of China, Beijing, China.
Zhao, Long, "Notification of the Second Office Action", Chinese Appplication No. 201210042250.2, mailed Aug. 1, 2014, 7 pages, The State Intellectual Property of the People's Republic of China, Beijing, China.
Notification of Reasons for Refusal, issued in corresponding Japanese Patent Application No. JP 2011-136176, dated Dec. 24, 2014.

* cited by examiner

WIRING BOARD AND MANUFACTURING METHOD THEREOF

The priority of Japan Patent Application Nos. 2011-035338 and 2011-136176 upon which this patent application is based is hereby incorporated by reference.

BACKGROUND OF THE INVENTION

Field of the Invention

The present invention relates to a wiring board having a through hole and a manufacturing method thereof.

Description of the Related Art

A wiring board consists of a fiber reinforced resin plate made of reinforcement fiber such as glass fiber and matrix resin. When a terminal, which is pressed and connected, is pressed in a through hole penetrating through the wiring board, a portion near the through hole of the wiring board whitens.

In this manner, the wiring board in which the whitening is generated is judged as inferior products. As a result, the productivity of the wiring board is reduced. Further, when a test of high temperatures and humidity is performed in the wiring board including the whitening, insulation properties result in low result and it becomes a problem.

In Patent Document 1, a technique relaxing physical stress when pressing a terminal in a through hole by changing a shape of the terminal is disclosed.

More specifically, as shown in FIG. 7, a press-fit terminal 9' including a press-fit portion having a noncontact dent $9d'$ is used in the Patent Document 1. As a result, a deformation of the through hole 7 and a cleave deformation of a buried resin portion can be prevented by elastic restoring force of the press-fit portion.

However, although using this technique, generation of the whitening in a portion around the through hole of the wiring board has not been able to prevent completely.

[Patent Document 1] JP, A, No. 2009-21016

SUMMARY OF THE INVENTION

Objects to be Solved

Accordingly, an object of the present invention is to provide a wiring board improving the above problem, that is, the wiring board having a through hole which can prevent generation of whitening.

The applicants of the present invention have conducted a search for a cause of the whitening in detail.

When a terminal 9 is pressed into a through hole 7, resin material $3b$ of a fiber reinforced resin plate 3 which consists of a glass cloth 3 made of glass fiber being a reinforcement fiber in the wiring board A and the resin material $3b$ impregnated with a fiber layer of the glass cloth 3 and hardened is destroyed by a stress of the terminal 9, and microcrack is generated, or glass fibers of a glass cloth $3a$ are delaminated (see FIG. 8). As a result, the wiring board around the through hole has whitened. As disclosed in the Patent Document 1, even if the stress is relaxed by changing the shape of the terminal, it is found that the whitening may occur. Thus, the applicant has invented the present invention based on such knowledge.

More specifically, in order to attain the above object, according to a first aspect of the present invention, the wiring board of the present invention consists of the fiber reinforced resin plate, and has a through hole and a whitening prevention portion made only with matrix resin forming the fiber reinforced resin plate. The whitening prevention portion is integrally formed in the fiber reinforce resin plate, and arranged around the through hole.

Furthermore, according to a second aspect of the present invention, a hollow shape land is arranged on a surface of the wiring board around the through hole, and an outer diameter of the land is larger than a diameter of the whitening prevention portion.

Furthermore, according to a third aspect of the present invention, a hollow shaped land is arranged on a surface of the wiring board around the through hole, and connected to a wiring of the wiring board via a wide portion larger than a width of the wiring.

According to a fourth aspect of the present invention, a manufacturing method of a wiring board made of a fiber reinforced resin plate and having a through hole, the manufacturing method comprising the steps of:

a reinforced fiber removing step configured to remove a forming portion of the through hole and a surrounding portion thereof from a prepreg forming the fiber reinforced resin plate; and a pressing forming step configured to press the prepreg.

Advantageous Effects of the Invention

According to the wiring board of the present invention, the wiring board having the through hole can be provided without a generation of the whitening around through hole.

Furthermore, in addition to the above effect, damage and disconnection can be prevented in advance when the wiring board is used in high temperatures and subjected to high temperatures.

The above and other objects and features of this invention will become more apparent from the following description taken in conjunction with the accompanying drawings.

DESCRIPTION OF THE PREFERRED EMBODIMENT

A wiring board according to an embodiment of the present invention will be explained with reference to drawings.

Figure 1:
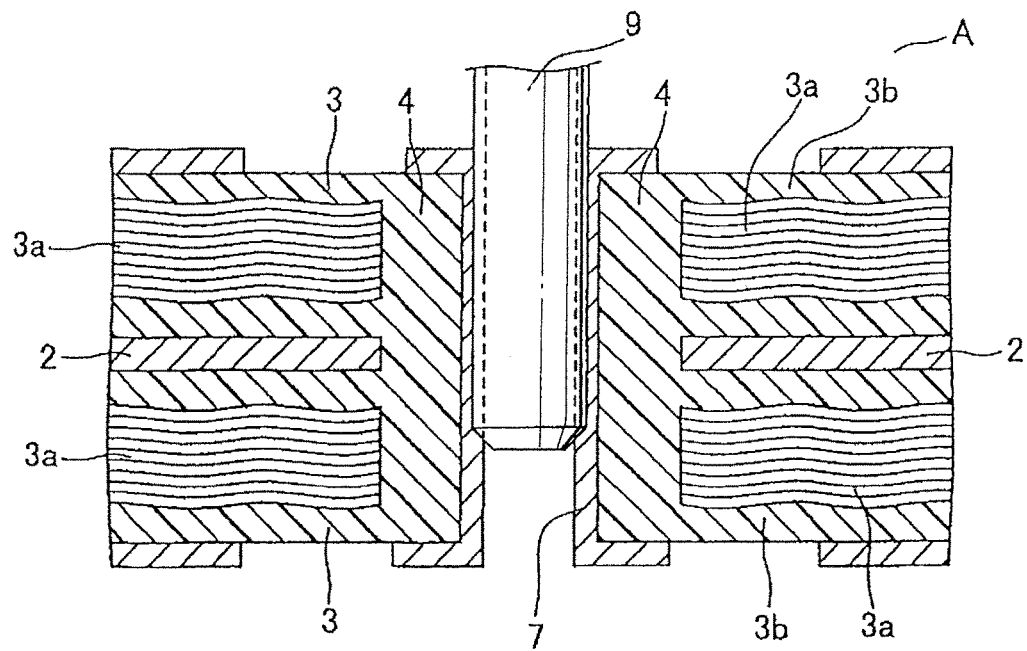
FIG. 1 is a modal cross-sectional view of a portion and where a through hole of a wiring board of the present invention is arranged and a surrounding portion of the through hole.

FIG. 1 is a model cross-sectional view showing a portion in which a through hole 7 of a wiring board A of the present invention is arranged. As shown in FIG. 1, a terminal 9 is pressed into the through hole 7.

The wiring board A is made of a fiber reinforced resin plate and has the through hole 7. The fiber reinforced resin plate is formed by laminating a prepreg which impregnates a glass cloth 3a with insulating resin composition such as matrix resin and is constructed and then by hardening the matrix resin. In this embodiment, a metal core 2 is laminated between two prepregs. A whitening prevention portion 4 made of the matrix resin constituting the fiber reinforced resin plate is arranged around the through hole 7.

The above wiring board A can be provided as follows.

The wiring board is made of the prepreg formed by impregnating the glass cloth with the matrix resin of thermoset resin. A portion forming the through hole or a surrounding portion thereof is removed from the prepreg of the wiring board (reinforced fiber removing step).

Next, the prepreg having a hole is laminated as needed, and then is hardened by press forming under the proper conditions (for example, heating temperature, press, and time) to the matrix resin, and formed. In this pressing forming step, the matrix resin has flow property, and the matrix resin reaches the portion in which the prepreg is partly removed. As a result, the portion, namely through hole forming portion, made only with matrix resin is integrally formed in the fiber reinforced resin plate.

After the wiring board is formed in this manner, the through hole is arranged in the through hole forming portion. Thereafter, the through hole is formed according to a general manufacturing method of the wiring board. The whitening prevention portion 4 made only with the matrix resin is arranged around the through hole. Thus, the wiring board having the whitening prevention portion 4 can be produced.

Figures 2A, 2B:
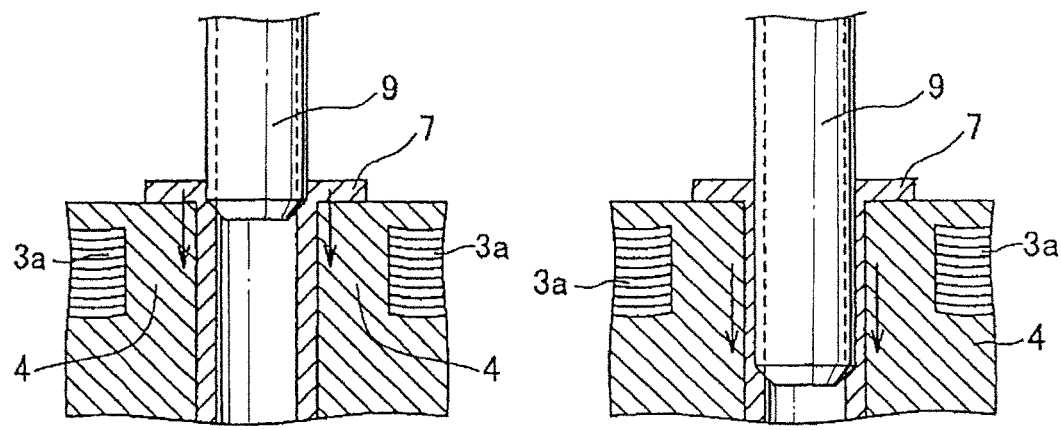
FIGS. 2A and 2B are views showing a state pressing a terminal into the through hole in the wiring board of the present invention.

In such the wiring board, the through hole 7 is away from the glass cloth 3a so as to arrange the whitening prevention portion 4 around the through hole 7. Therefore, as shown in FIGS. 2A and 2B, when the terminal 9 is pressed into the through hole 7, delamination of fibers of glass clothes 3a and destruction of resin material impregnating the fiber layer of glass cloth 3a and hardening are prevented even if the through hole 7 is subjected to press fit stress in a direction of the arrows shown in FIGS. 2A and 2B and is stressed in a radial direction. Thus, the whitening is not generated.

In the above example, single-layered the metal core 2 is arranged in the wiring board A. However, it is not limited thereto. For example, the wiring board may have a plurality of the metal cores, and may not have the metal core.

When the wiring board is used in a high-temperature environment, for example, the wiring board is used near a dashboard or inside of a door, stress may be added between land in itself and/or wirings of the wiring board connected to a land from difference of rate of thermal expansion between the whitening prevention portion and the fiber reinforced resin plate. As a result, damage and disconnection may be generated.

Figure 3A:
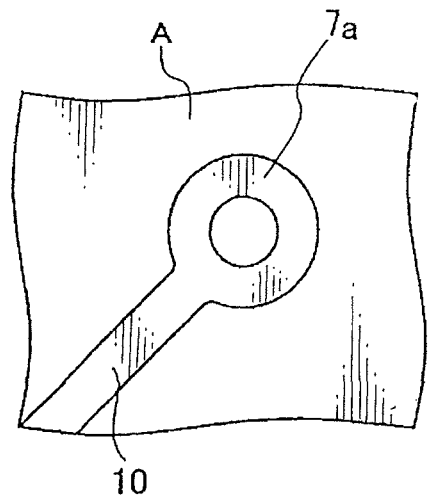
FIG. 3A is a top view of a model illustrating a problem generated at a high temperature.

More specifically, as shown in FIG. 3A, a hollow disk-shaped land 7a is arranged around the through hole 7 of the wiring board A. A wiring 10 of a wiring board A is integrally connected to the land 7a in this embodiment.

Figure 3B:
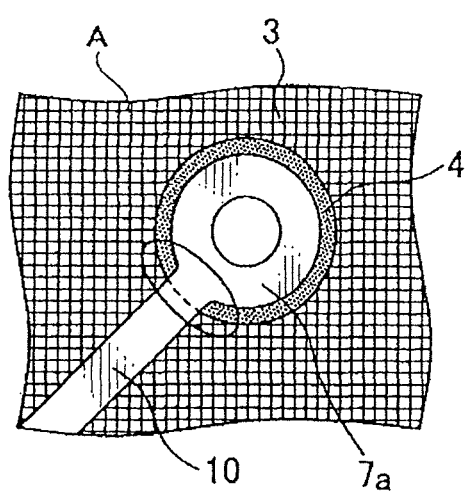
FIG. 3B is a perspective view from the top face.

As shown in FIG. 3B, the whitening prevention portion 4 is arranged around an edge of the land 7a, and the prepreg 3 of the fiber reinforced resin plate is arranged around the whitening prevention portion 4. Furthermore, a portion enclosed with an oval shown in FIG. 3B is a connection connecting with the land 7a and the wiring 10.

Figure 4A:
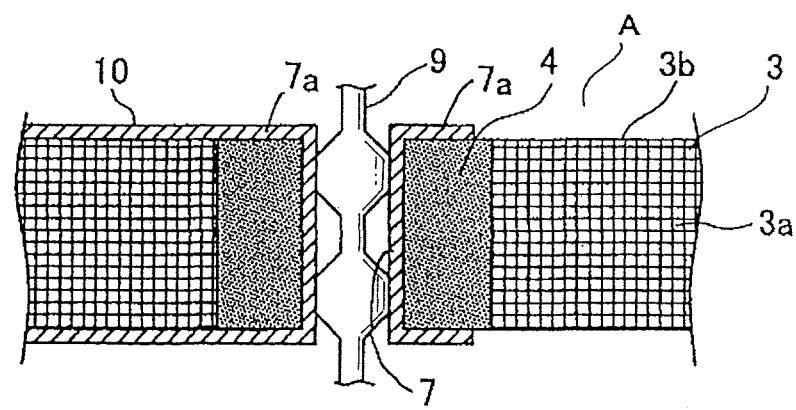
FIG. 4A is a cross-section view illustrating the problem generated at high temperatures and showing a state before heat history.

FIG. 4A shows a cross-sectional view near the through hole 7 of the wiring board A.

Figure 4B:
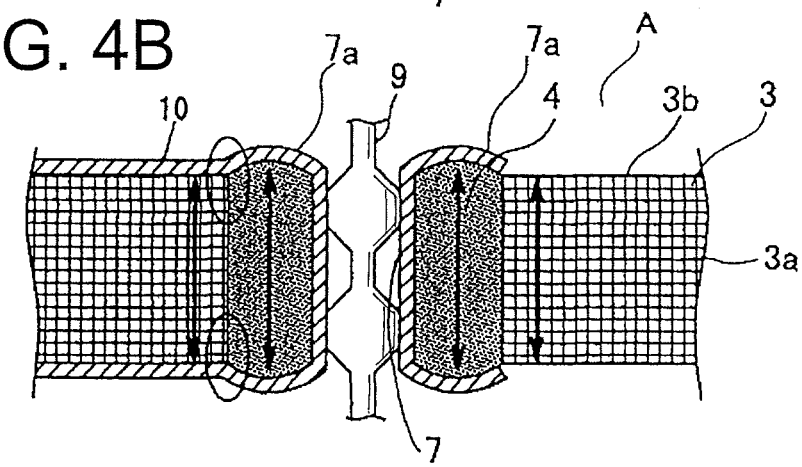
FIG. 4B is a cross-section view illustrating the problem generated at high temperatures and showing a high temperature state.

The whitening prevention portion 4 is arranged close to the edge of the land 7a. Because of the arrangement, when the wiring board is subjected to heat, the whitening prevention portion 4 which does not include the glass cloth 3a is easily expanded as shown with a double-headed arrow in FIG. 4B. At that time, breakage and disconnection may occur in the connection connecting the land 7a with the wiring 10 and shown with the oval in FIG. 4B.

Figure 5A:
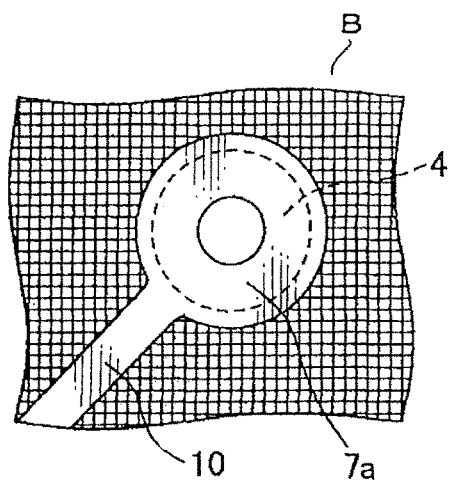
FIG. 5A is a perspective view from the face and shows a wiring board B solving the problem generated at high temperatures.
Figure 5B:
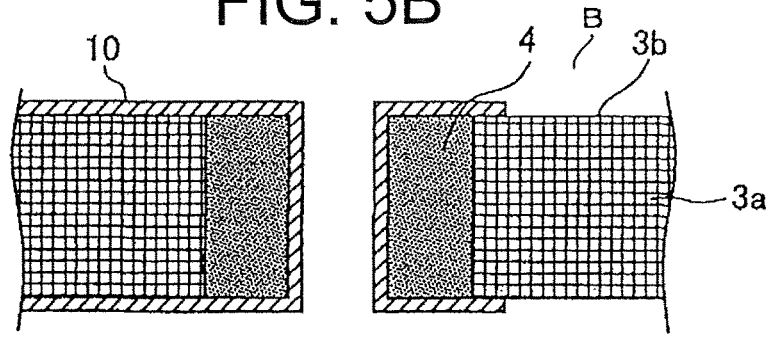
FIG. 5B is a cross-sectional view and shows a wiring board B solving the problem generated at high temperatures.

In order to prevent the breakage and the disconnection in the connection connecting the land 7a with the wiring 10, an outer diameter of the land 7a is formed larger than an outer diameter of the whitening prevention portion 4 as shown in FIG. 5A. Thus, the connection connecting the land 7a with the wiring 10 does not come in contact with the whitening prevention portion 4. Furthermore, although expansion is caused by heat of the whitening prevention portion 4, the breakage and disconnection in the connection can be prevented because the connection is unaffected by the heat.

In addition, a wide portion larger than a width of the wiring 10 may be arranged in the connection connecting the wiring 10 with the land 7a besides arranging the land 7a larger than the whitening prevention portion 4.

Figure 6:
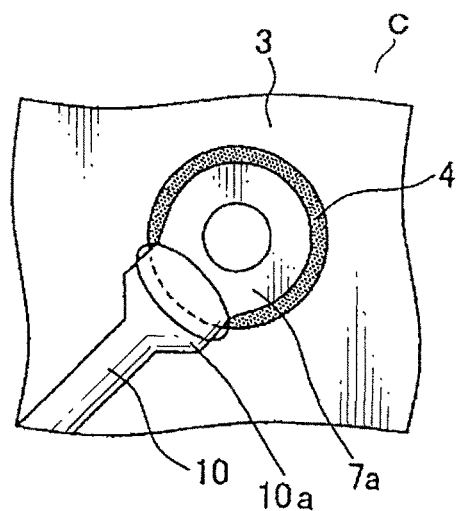
FIG. 6 is a model view showing a wiring board C solving the problem generated at high temperatures.
Figure 7:
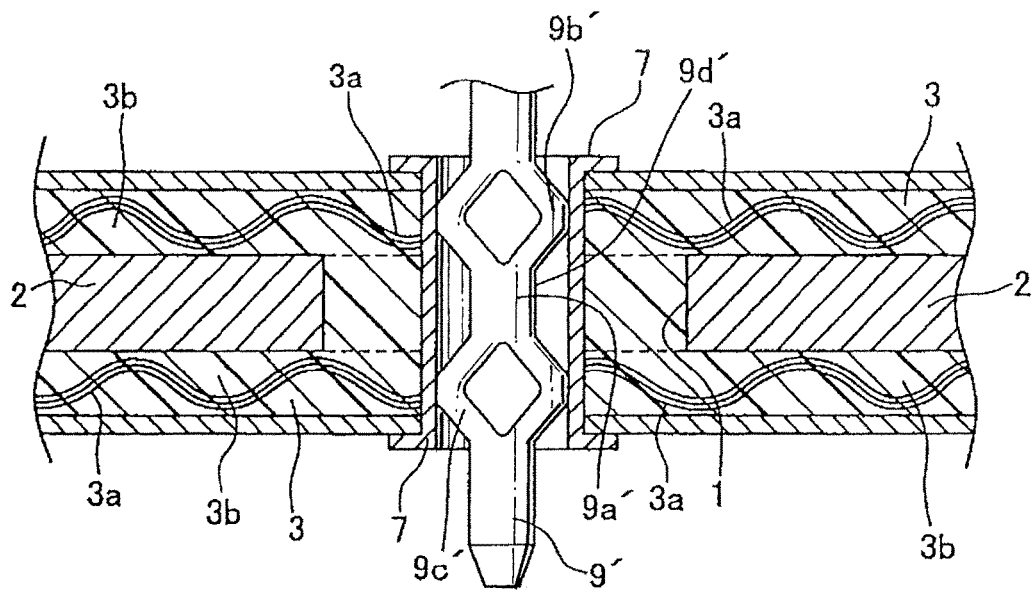
FIG. 7 is a model view showing conventional one example.
Figure 8A:
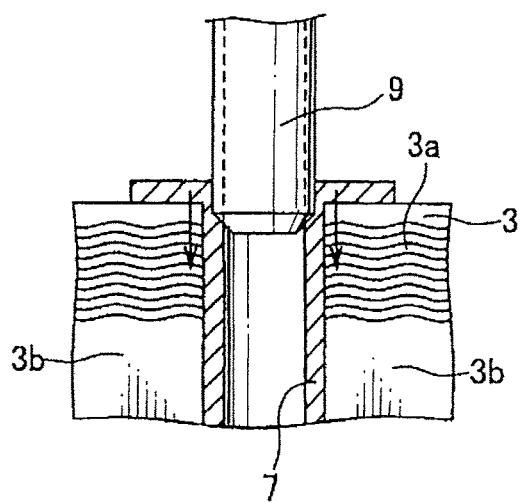
FIGS. 8A and 8B are model views showing a cause of whitening generated around the through hole.
Figure 8B:
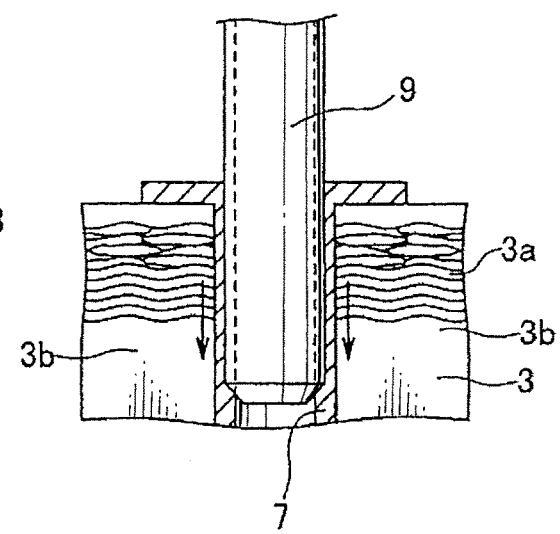

A specific example is shown in FIG. 6. In the example shown in FIG. 6, the land 7a smaller than the whitening prevention portion 4 is arranged, and a wide portion 10a larger than a width of the wiring 10 is arranged in a boundary between the whitening prevention portion 4 and the fiber reinforced resin plate 3. Further, the land 7a is connected to the wiring 10 via the wide portion 10a. Since such the wide portion 10a is arranged, the wide portion 10a can oppose the stress generated when the expansion is caused by heat of the whitening prevention portion 4. As a result, the breakage and disconnection in the connection connecting the land 7a with the wiring 10 can be prevented in advance.

The hollow disk-shaped land 7a was explained as an example in the above embodiment. However, the prevent invention is not limited to the disk-shaped land 7a. For example, various shapes such as an ellipse or box shape may be applied to the present invention.

It is intended that the above-described embodiment is only a representative embodiment, and it should be understood that the present invention is not limited thereto. Various changes and modifications can be made without departing the scope of the present invention.

What is claimed is:

1. A manufacturing method of a wiring board made of a fiber reinforced resin plate formed of matrix resin and a glass fiber portion and having a through hole, the manufacturing method comprising the steps of:

a reinforced fiber removing step which removes a forming portion of the through hole and a surrounding portion thereof from a prepreg forming the fiber reinforced resin plate;

a pressing forming step which presses the prepreg of the fiber reinforced resin plate in which the prepeg of the forming portion of the through hole and the surrounding portion thereof has been removed and causes matrix resin included in the prepeg to flow toward the forming portion, such that the forming portion is subsequently made only with the matrix resin and integrally formed in the fiber reinforced resin plate; and a forming step which forms the through hole in the forming portion, wherein the through hole is substantially surrounded by only the matrix resin, which is positioned between the through hole and the glass fiber portion, and configured to receive a terminal press-fit therethrough.

* * * * *